(12) United States Patent
Lin et al.

(10) Patent No.: US 8,309,452 B2
(45) Date of Patent: Nov. 13, 2012

(54) METHOD OF FORMING AN INDUCTOR ON A SEMICONDUCTOR WAFER

(75) Inventors: Yaojian Lin, Singapore (SG); Haijing Cao, Singapore (SG); Qing Zhang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/826,365

(22) Filed: Jun. 29, 2010

(65) Prior Publication Data

US 2010/0264516 A1  Oct. 21, 2010

Related U.S. Application Data

(63) Continuation of application No. 11/936,461, filed on Nov. 7, 2007, now Pat. No. 7,772,106.

(51) Int. Cl.
*H01L 21/44* (2006.01)
*H01L 21/60* (2006.01)

(52) U.S. Cl. ................ 438/614; 257/E21.507

(58) Field of Classification Search ............ 438/14, 438/381, 612–614, 618, 622–627, 233, 586, 438/597–599, 602–607, 666, 669–676
See application file for complete search history.

(56) References Cited

U.S. PATENT DOCUMENTS

| | | | |
|---|---|---|---|
| 5,478,773 A | 12/1995 | Dow et al. | |
| 6,475,897 B1 | 11/2002 | Hosaka | |
| 6,890,794 B2 | 5/2005 | Rotem | |
| 7,207,096 B2 | 4/2007 | Gambino et al. | |
| 2005/0024176 A1 | 2/2005 | Wang et al. | |
| 2005/0160575 A1* | 7/2005 | Gambino et al. | 29/602.1 |
| 2005/0250316 A1 | 11/2005 | Choi et al. | |
| 2006/0214260 A1* | 9/2006 | Cho et al. | 257/529 |
| 2007/0026659 A1 | 2/2007 | Chinthakindi et al. | |
| 2007/0080455 A1 | 4/2007 | Zupanski-Nielsen et al. | |
| 2007/0186412 A1* | 8/2007 | Hsu et al. | 29/830 |
| 2008/0182432 A1* | 7/2008 | Huang et al. | 439/66 |

\* cited by examiner

*Primary Examiner* — Leonard Chang
*Assistant Examiner* — Calvin Choi
(74) *Attorney, Agent, or Firm* — Robert D. Atkins; Patent Law Group: Atkins & Associates, P.C.

(57) ABSTRACT

A semiconductor device has a substrate with an inductor formed on its surface. First and second contact pads are formed on the substrate. A passivation layer is formed over the substrate and first and second contact pads. A protective layer is formed over the passivation layer. The protective layer is removed over the first contact pad, but not from the second contact pad. A conductive layer is formed over the first contact pad. The conductive layer is coiled on the surface of the substrate to produce inductive properties. The formation of the conductive layer involves use of a wet etchant. The second contact pad is protected from the wet etchant by the protective layer. The protective layer is removed from the second contact pad after forming the conductive layer over the first contact pad. An external connection is formed on the second contact pad.

24 Claims, 4 Drawing Sheets

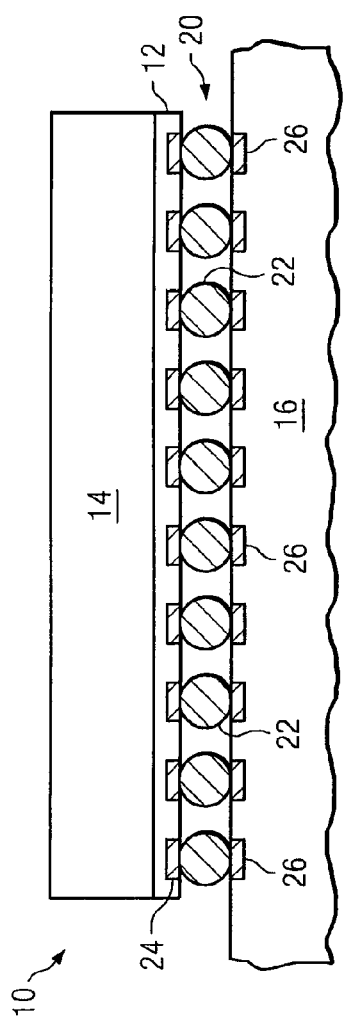
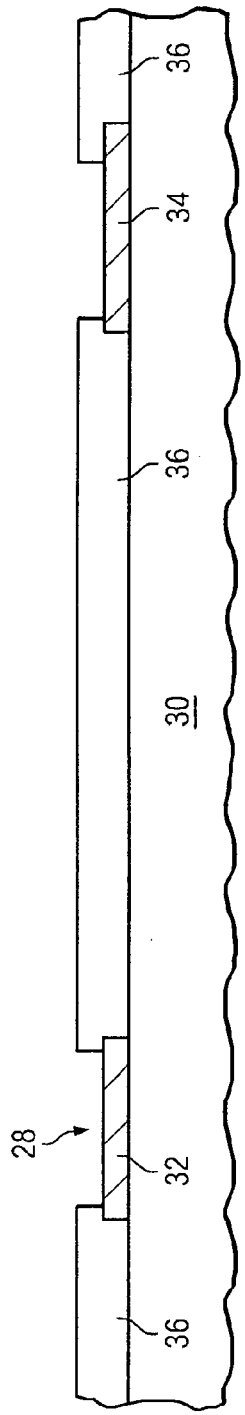
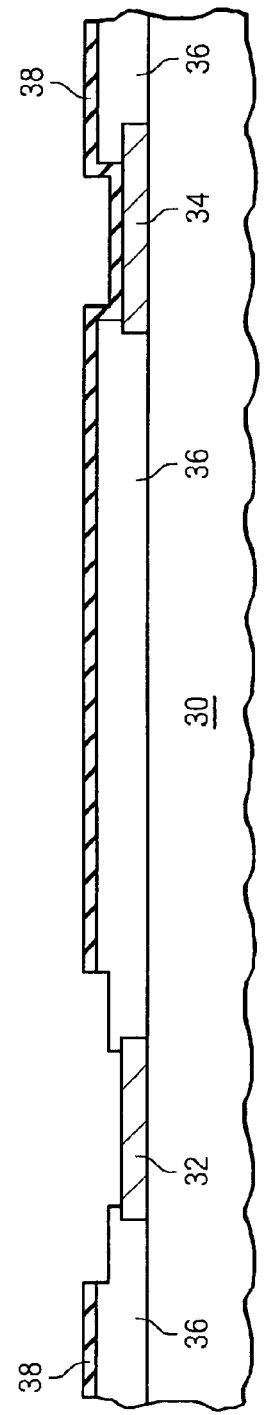

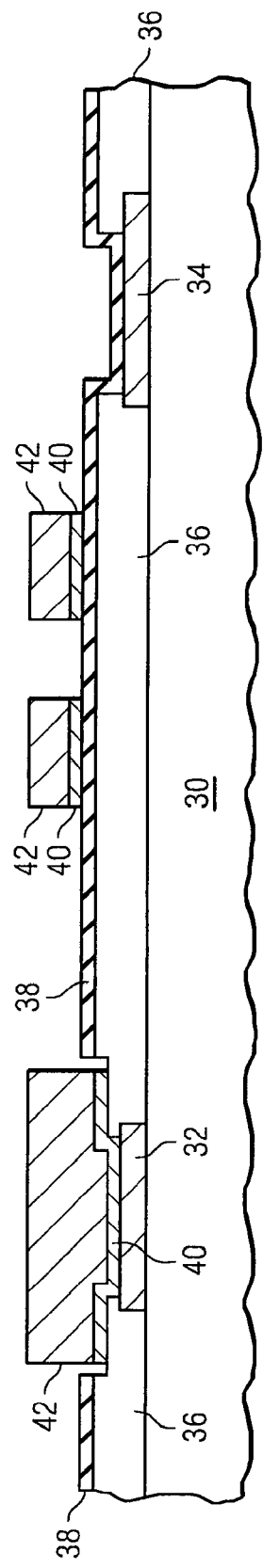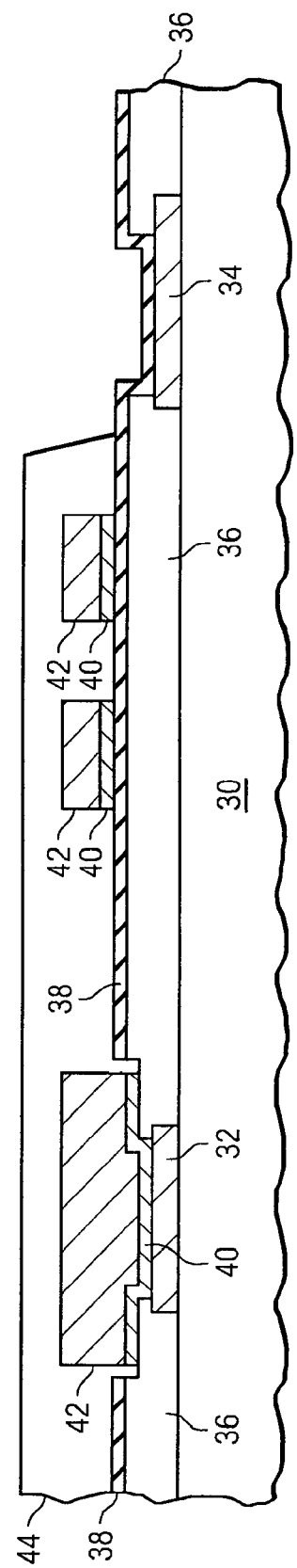

METHOD OF FORMING AN INDUCTOR ON A SEMICONDUCTOR WAFER

CLAIM OF DOMESTIC PRIORITY

The present application is a continuation of U.S. Patent Application No. 11/936,461, filed Nov. 7, 2007, now U.S. Pat. No. 7,772,106.

FIELD OF THE INVENTION

The present invention relates in general to semiconductor devices and, more particularly, to formation of an inductor on a semiconductor wafer.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, including an inductor, on the semiconductor wafer. The inductor allows the IC to perform reactive circuit functions without using external circuit components. The inductors are formed as coiled or wound metal layers on the surface of the substrate. The deposition and patterning of the inductor metal layers typically involves a wet etching process. The wet etchant can cause chemical degradation to other metal layers on the wafer surface, for example to external wire bond, solder bump, and RDL pads. The chemical degradation may cause defects in the external connection pad and reduce manufacturing yield.

A need exists to form an inductor without degrading other metal layers on the semiconductor wafer.

SUMMARY OF THE INVENTION

In one embodiment, the present invention is a method of making a semiconductor device comprising the steps of providing a substrate, forming first and second contact pads over the substrate, forming a first passivation layer over the substrate and first and second contact pads, removing a portion of the first passivation layer over the first and second contact pads, forming a protective layer over the first passivation layer and first and second contact pads such that the protective layer follows a contour of the first and second contact pads and first passivation layer, removing the protective layer over the first contact pad and first passivation layer while maintaining the protective layer over the second contact pad, forming a conductive layer over the first contact pad and first passivation layer, forming a second passivation layer over the conductive layer and protective layer, removing the protective layer from the second contact pad after forming the second passivation layer, and forming an interconnect structure electrically connected to the second contact pad.

In another embodiment, the present invention is a method of making a semiconductor device comprising the steps of providing a substrate, forming first and second contact pads over the substrate, forming a first insulating layer over the substrate and first and second contact pads, removing a portion of the first insulating layer over the first and second contact pads, forming a protective layer over the first insulating layer and first and second contact pads such that the protective layer follows a contour of the first and second contact pads and first insulating layer, removing the protective layer over the first contact pad and first insulating layer while maintaining the protective layer over the second contact pad, forming a conductive layer over the first insulating layer, and forming a second insulating layer over the conductive layer and protective layer.

In another embodiment, the present invention is a method of making a semiconductor device comprising the steps of providing a substrate, forming first and second contact pads over the substrate, forming a first insulating layer over the substrate, forming a protective layer over the first insulating layer and first and second contact pads, removing the protective layer over the first contact pad and first insulating layer while maintaining the protective layer over the second contact pad, forming a conductive layer over the first insulating layer, and forming a second insulating layer over the conductive layer and protective layer. The protective layer protects the second contact pad during formation of the conductive layer.

In another embodiment, the present invention is a semiconductor device comprising a substrate and first and second contact pads formed over the substrate. A first insulating layer is formed over the substrate and first and second contact pads. A protective layer is formed over the first insulating layer and second contact pad. The protective layer is absent from the first contact pad. A conductive layer is formed over the first insulating layer. The protective layer protects the second contact pad. A second insulating layer is formed over the conductive layer and protective layer.

BRIEF DESCRIPTION OF THE DRAWINGS

FIG. 1 is a flip chip semiconductor device with solder bumps providing electrical interconnect between an active area of the die and a chip carrier substrate;

FIGS. 2a-2f illustrate a process of forming an inductor on a semiconductor wafer connected to a wire bond.

DETAILED DESCRIPTION OF THE DRAWINGS

Figure 2E:
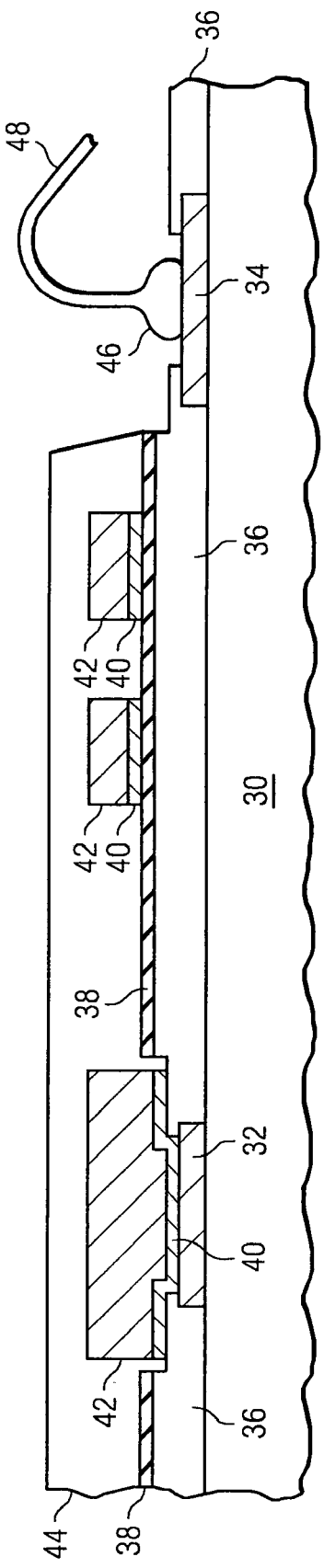

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads 24, which are disposed on active area 12. The bump pads 24 connect to the active circuits by conduction tracks in active area 12. The solder bumps 22 are electrically and mechanically connected to contact pads 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2a-2f illustrate formation of an inductor on a semiconductor wafer. FIG. 2a illustrates a cross-sectional view of semiconductor wafer 28. Substrate 30 is made of silicon or other bulk semiconductor material. Substrate 30 is the foundation of the active IC wafer and includes final metal and passivation. Contact pads 32 and 34 are part of the final metal and are patterned and deposited on substrate 30. Contact pads 32 and 34 can be made with aluminum (Al), copper (Cu), tin (Sn), nickel (Ni), gold (Au), silver (Ag), or other electrically conductive material. The deposition of contact pads 32 and 34 uses an evaporation, electrolytic plating, electroless plating, or screen printing process. Contact pad 32 will be used for the inductor connection. Contact pad 34, which may be electrically common with contact pad 32 will be used for an external wire bond connection, and additional input and output (I/O) redistribution connection.

A passivation layer 36 is a final passivation layer on semiconductor wafer 28 and is formed and patterned over the entire wafer, including substrate 30 and contact pads 32 and 34. Passivation layer 36 can be made with silicon nitride ($SixNy$), silicon dioxide ($SiO2$), silicon oxynitride (SiON), polyimide (PI), benzocyclobutene (BCB), polybenzoxazole (PBO), or other polymer material. A portion of passivation layer 36 is removed using a mask-defined photoresist etching process to expose contact pads 32 and 34.

In FIG. 2b, a thin insulating protective layer 38 is deposited by chemical vapor deposition (CVD) or physical vapor deposition (PVD) such as sputtering, and then patterned over passivation layer 36 and contact pads 32 and 34. The insulating layer 38 follows the contour of passivation layer 36 and contact pads 32 and 34. The insulating layer 38 can be made with $SixNy$, $SiO2$, SiON, tantalum pentoxide ($Ta2O5$), zinc oxide (ZnO), or other material having dielectric properties. The thickness of insulating layer 38 typically ranges from 250 to 3000 angstroms (Å). In one embodiment, insulating layer 38 is 300-400 Å.

A portion of insulating layer 38 over contact pad 32 is etched using a mask-defined etching process to expose contact pad 32. The opening of insulation layer 38 over pad 32 can be larger or less than the size of contact pad 32. Due to over-etching and selectivity, a portion of passivation layer 36 may also removed during the etching process, as seen by the notch or step in insulating layer 38 over contact pad 32.

At this stage, only contact pad 32 is exposed. Contact pad 34 remains covered by insulating layer 38. The insulating layer 38 over contact pad 34 protects the contact pad during the wet etching used to form adhesion layer 40 and inductor layer 42, as described in FIG. 2c, and prevents the wet etchant from chemically degrading the metal in contact pad 34. Consequently, the thickness of contact pad 34 remains the same, in areas under passivation layer 36 and in areas not under passivation layer 36, during the formation of inductor layer 42.

In FIG. 2c, a metal adhesion layer 40 is deposited over and follows the contour of contact pad 32 and the notched portion of passivation layer 36. The adhesion layer 40 can be made with titanium (Ti), titanium tungsten (TiW), or chromium (Cr). The thickness of adhesion layer 40 ranges from 200-2000 Å, with a typical thickness of 1000 Å. A metal layer 42 is deposited and adhesive layer 40 is patterned using a wet etch process. The metal layer 42 is the inductor on semiconductor wafer 28. The metal layer 42 and adhesion layer 40 are typically wound or coiled in plan view on the surface of substrate 30 to produce or exhibit the desired inductive properties, as shown by the three regions 40 in the cross-sectional view of FIG. 2c. The inductor layer 42 can be made with Cu or Al. The deposition of inductor layer 42 uses an evaporation, electrolytic plating, electroless plating, or screen printing process.

In FIG. 2d, a passivation layer 44 is formed over insulating layer 38 and inductor layer 42 for structural support and physical isolation. Passivation layer 44 can be made with SiN, SiO2, SiON, PI, BCB, PBO, or other polymer material.

In FIG. 2e, the portion of insulating layer 38 over contact pad 34 is removed using a mask-defined plasma or dry etching process to avoid damaging the contact pad metal. Wire bond 46 with bond wire 48 is formed on contact pad 34 for external electrical connection. In one embodiment, wire bond 46 connects to inductor layer 42, and potentially other the circuit elements, by way of contact pads 32 and 34.

Figure 2F:
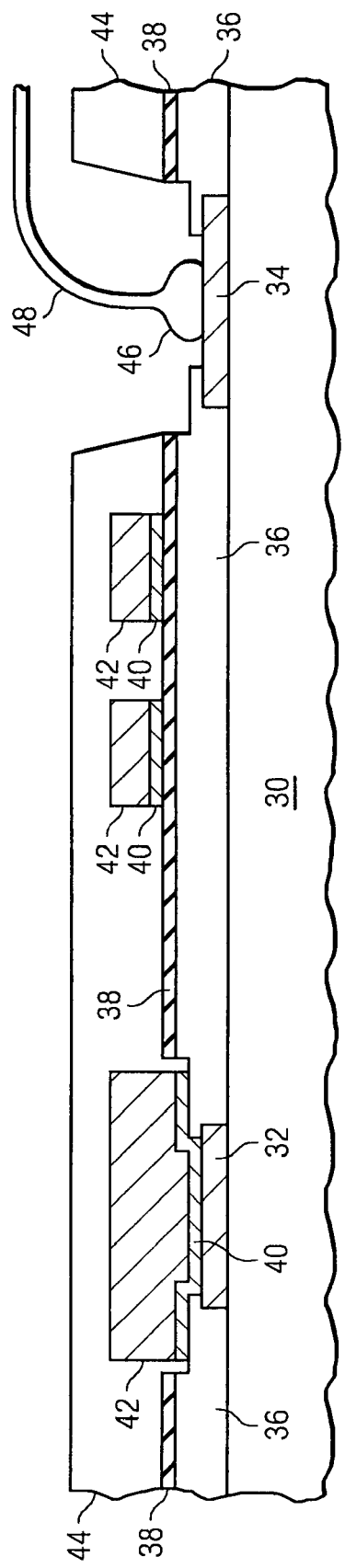

In another embodiment, a via is formed in passivation layer 44 using a mask-defined plasma or dry etching process, as shown in FIG. 2f. The via in the passivation layer 44 can be used as the mask for the plasma or dry etch to remove the portion of insulating layer 38 over contact pad 34.

Figure 3:
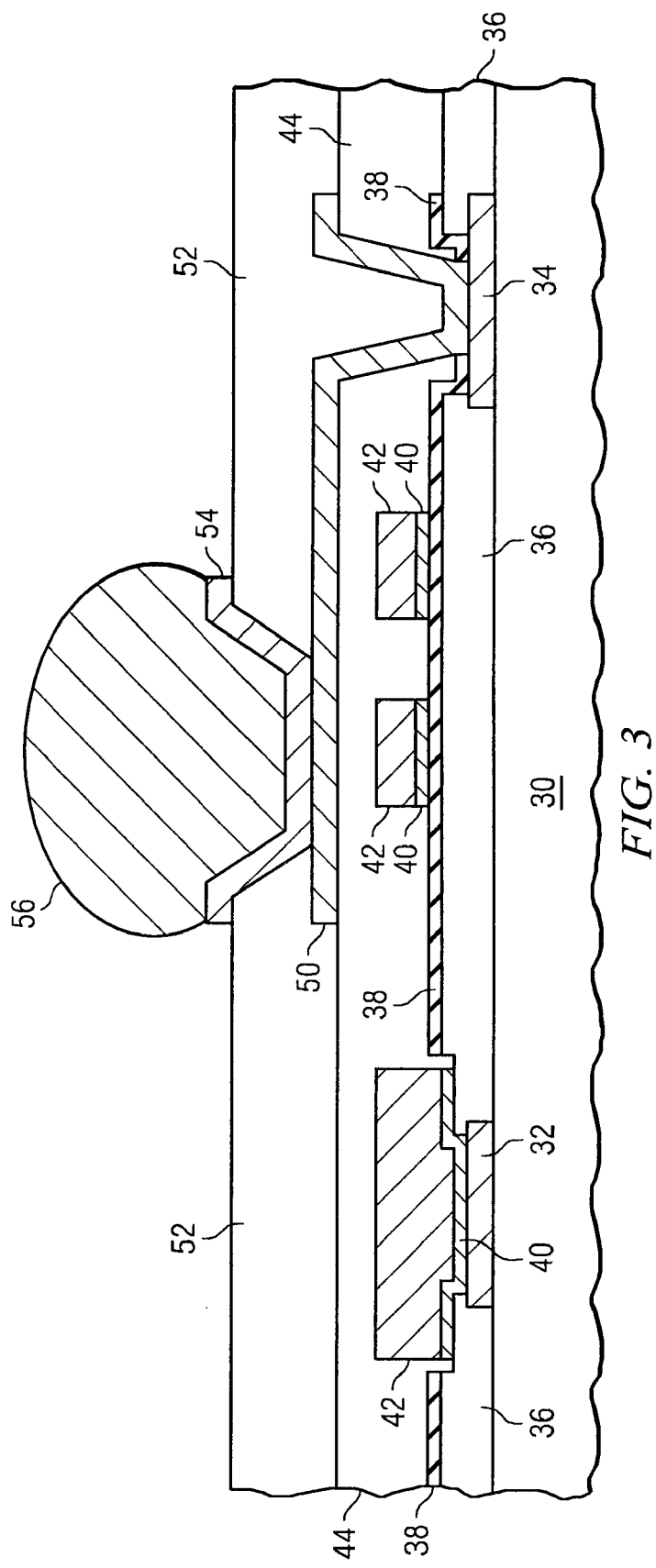
FIG. 3 illustrates an alternate embodiment of the inductor formed on a semiconductor wafer and connected to a solder bump.

An alternate embodiment of the formation of an inductor on a semiconductor wafer is shown in FIG. 3. In the same manner described in FIGS. 2a-2f, contact pads 32 and 34 are patterned and deposited on substrate 30. Contact pad 34, which is electrically common with contact pad 32, will be used for an external connection. A passivation layer 36 is formed over substrate 30 and contact pads 32 and 34. A thin insulating protective layer 38 is deposited and patterned over passivation layer 36 and contact pads 32 and 34.

A portion of insulating layer 38 is removed using a mask-defined etching process to expose contact pad 32. At this stage, only contact pad 32 is exposed. Contact pad 34 remains covered by insulating layer 38. The insulating layer 38 over contact pad 34 protects the contact pad during the wet etching used to form adhesion layer 40 and inductor layer 42, as described in FIG. 2c, and prevents the wet etchant from chemically degrading the metal in contact pad 34. Consequently, the thickness of contact pad 34 remains the same, in areas under passivation layer 36 and in areas not under passivation layer 36, during the formation of inductor layer 42.

A metal adhesion layer 40 is deposited over and follows the contour of contact pad 32 and the notched portion of passivation layer 36. A metal layer 42 is deposited and patterned over adhesion layer 40 using a wet etch process. The metal layer 42 is the inductor on semiconductor wafer 28. The metal layer 40 is typically wound or coiled in plan view on the surface of substrate 30 to produce the desired inductive properties, as shown by the three regions 40 in the cross-sectional view of FIG. 2c. A passivation layer 44 is formed over insulating layer 38 and inductor layer 42 for structural support and physical isolation.

The portion of insulating layer 38 over contact pad 34 is removed using a mask-defined plasma or dry etching process to avoid damaging the contact pad metal. In another embodiment, a via is formed in passivation layer 44 using a mask-defined plasma or dry etching process, as shown in FIG. 2f. The via in the passivation layer 44 can be used as the mask for the plasma or dry etch to remove the portion of insulating layer 38 over contact pad 34.

A redistribution layer (RDL) 50 is deposited over passivation layer 44 and contact pad 34. RDL 50 can be made with Al, Ni, nickel vanadium (NiV), Cu, or Cu alloy. RDL 50 can be made with a single layer, or multiple layers using an adhesion layer of Ti, TiW, or Cr. A passivation layer 52 is formed over passivation layer 44 and RDL 50. Passivation layer 52 can be made with SixNy, SiO2, SiON, PI, BCB, PBO, or other polymer material. A portion of passivation layer 54 is removed using a mask-defined etching process to expose RDL 50. A metal layer 54 is deposited over passivation layer 52 and RDL 50 by an evaporation, electrolytic plating, electroless plating, or screen printing process. Metal layer 54 is an under bump metallization (UBM) layer. UBM 54 can be made with Ti, Ni, NiV, Cu, or Cu alloy.

An electrically conductive solder material is deposited over UBM 54 through an evaporation, electrolytic plating, electroless plating, or screen printing process. The electrically conductive material is any metal, e.g., Sn, lead (Pb), Ni, Au, Ag, Cu, bismuthinite (Bi), and alloys thereof, or mixtures of other conductive materials. In one embodiment, the solder material is 63 percent weight of Sn and 37 percent weight of Pb. The solder material is reflowed by heating the conductive material above its melting point to form spherical all or bump 56. In one embodiment, solder bump 56 is about 75 μm in height. In some applications, solder bump 56 is reflowed a second time to improve electrical contact to UBM 54. RDL 50 operates as an intermediate conductive layer to route electrical signals from inductor layer 42 to solder bump 56.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    forming first and second contact pads over the substrate;
    forming a first passivation layer over the substrate and first and second contact pads;
    removing a portion of the first passivation layer over the first and second contact pads;
    forming a protective layer over the first passivation layer and first and second contact pads such that the protective layer follows a contour of the first and second contact pads and first passivation layer;
    removing the protective layer over the first contact pad and first passivation layer while maintaining the protective layer over the second contact pad;
    forming a conductive layer over the first contact pad and first passivation layer;
    forming a second passivation layer over the conductive layer and protective layer;
    removing the protective layer from the second contact pad after forming the second passivation layer; and
    forming an interconnect structure electrically connected to the second contact pad.

2. The method of claim 1, wherein the conductive layer follows the contour of the first and second contact pads and first passivation layer.

3. The method of claim 1, wherein the conductive layer is coiled to exhibit inductive properties.

4. The method of claim 1, wherein the interconnect structure includes a wire bond or bump.

5. The method of claim 1, further including forming a redistribution layer electrically connected to the second contact pad and interconnect structure.

6. The method of claim 1, further including using the second passivation layer as a mask to remove the protective layer over the second contact pad.

7. A method of making a semiconductor device, comprising:
    providing a substrate;
    forming first and second contact pads over the substrate;
    forming a first insulating layer over the substrate and first and second contact pads;
    removing a portion of the first insulating layer over the first and second contact pads;

forming a protective layer over the first insulating layer and first and second contact pads such that the protective layer follows a contour of the first and second contact pads and first insulating layer;

removing the protective layer over the first contact pad and first insulating layer while maintaining the protective layer over the second contact pad;

forming a conductive layer over the first insulating layer including using an etchant; and forming a second insulating layer over the conductive layer and protective layer.

8. The method of claim 7, further including:

removing the protective layer from the second contact pad after forming the second insulating layer; and forming an interconnect structure electrically connected to the second contact pad.

9. The method of claim 8, wherein the interconnect structure includes a wire bond or bump.

10. The method of claim 8, further including forming a redistribution layer electrically connected to the second contact pad and interconnect structure.

11. The method of claim 7, wherein the conductive layer is coiled to exhibit inductive properties.

12. The method of claim 7, wherein the conductive layer follows the contour of the first and second contact pads and first insulating layer.

13. The method of claim 7, wherein the protective layer includes a dielectric material.

14. A method of making a semiconductor device, comprising:

providing a substrate;

forming first and second contact pads over the substrate;

forming a first insulating layer over the substrate;

forming a protective layer over the first insulating layer and first and second contact pads;

removing the protective layer over the first contact pad while maintaining the protective layer over the second contact pad;

forming a conductive layer over the first insulating layer, the protective layer protecting the second contact pad during formation of the conductive layer; and forming a second insulating layer over the conductive layer and protective layer.

15. A method of making a semiconductor device, comprising:

providing a substrate;

forming first and second contact pads over the substrate;

forming a first insulating layer over the substrate;

forming a protective layer over the first insulating layer and first and second contact pads;

removing the protective layer over the first contact pad and first insulating layer while maintaining the protective layer over the second contact pad;

forming a conductive layer over the first insulating layer, the protective layer protecting the second contact pad during formation of the conductive layer;

forming a second insulating layer over the conductive layer and protective layer;

removing the protective layer from the second contact pad after forming the second insulating layer; and forming an interconnect structure electrically connected to the second contact pad.

16. The method of claim 15, wherein the interconnect structure includes a wire bond or bump.

17. The method of claim 15, further including forming a redistribution layer electrically connected to the second contact pad and interconnect structure.

18. The method of claim 15, wherein the conductive layer is coiled to exhibit inductive properties.

19. The method of claim 15, wherein the protective layer follows a contour of the first and second contact pads and first insulating layer.

20. The method of claim 19, wherein the conductive layer follows the contour of the first and second contact pads and first insulating layer.

21. The method of claim 14, further including forming a redistribution layer electrically connected to the second contact pad.

22. The method of claim 14, wherein the conductive layer is coiled to exhibit inductive properties.

23. The method of claim 14, wherein the protective layer follows a contour of the first and second contact pads and first insulating layer.

24. The method of claim 23, wherein the conductive layer follows the contour of the first and second contact pads and first insulating layer.

* * * * *